United States Patent
Rhee

(10) Patent No.: US 7,282,958 B2
(45) Date of Patent: Oct. 16, 2007

(54) MULTIPLEX (MUX) CIRCUIT HAVING A SINGLE SELECTION SIGNAL AND METHOD OF GENERATING A MUX OUTPUT SIGNAL WITH SINGLE SELECTION SIGNAL

(75) Inventor: Young-Chul Rhee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 32 days.

(21) Appl. No.: 10/992,077

(22) Filed: Nov. 19, 2004

(65) Prior Publication Data
US 2005/0162192 A1    Jul. 28, 2005

(30) Foreign Application Priority Data
Jan. 28, 2004    (KR) .................... 10-2004-0005309

(51) Int. Cl.
*H03K 19/094*    (2006.01)
*H03K 17/00*    (2006.01)

(52) U.S. Cl. ...................... 326/113; 327/408
(58) Field of Classification Search .................. 326/17, 326/106, 108, 113; 327/407, 408
See application file for complete search history.

(56) References Cited

U.S. PATENT DOCUMENTS 5,376,829 A * 12/1994 Rogers et al. .............. 327/408

FOREIGN PATENT DOCUMENTS

| JP | 59-215124 A | 12/1984 |
|---|---|---|
| JP | 5-129910 A | 5/1993 |
| JP | 2003-91994 A | 3/2003 |
| KR | 97004057 B1 | 3/1997 |

* cited by examiner

*Primary Examiner*—Daniel D. Chang
(74) *Attorney, Agent, or Firm*—Harness, Dickey & Pierce, PLC

(57) ABSTRACT

A MUX circuit may include a plurality of inverter pairs for receiving one of a first input signal and a second input signal to generate a plurality of inverter outputs. The circuit may also include a plurality of switches operatively connected to the plurality of inverter pairs and to a single selection signal for selectively transmitting at least one of the inverter outputs representing one of the first and second input signals as a MUX circuit output signal, based on the selection signal. Generating an output signal from the high-speed MUX circuit may include generating the single selection signal therein and transmitting one of the first and second input signal as a MUX circuit output signal, based on the single selection signal.

18 Claims, 1 Drawing Sheet

MULTIPLEX (MUX) CIRCUIT HAVING A SINGLE SELECTION SIGNAL AND METHOD OF GENERATING A MUX OUTPUT SIGNAL WITH SINGLE SELECTION SIGNAL

CROSS-REFERENCE TO RELATED APPLICATIONS

This application claims the priority of Korean Patent Application No. 2004-5309, filed on Jan. 28, 2004, in the Korean Intellectual Property Office, the disclosure of which is incorporated herein in its entirety by reference.

BACKGROUND OF THE INVENTION

1. Field of the Invention

The present invention relates generally to a multiplex circuit having a single selection signal and to a method of generating a MUX output signal with a single selection signal.

2. Description of the Related Art

In digital technology, various logic techniques are being employed for high-speed operations. An example of these various logic devices is a transmission gate which is used to transmit a signal. A dual-rail method may be adopted for high-speed signal transmission operation for the transmission gate. In general, the dual-rail method transmits an output signal from a received input signal in response to a transmission gate enabling signal and a complementary enabling signal. The enabling signal (which may also be referred to as a 'selection signal') enables the transmission gate; the complementary enabling signal is an inverted version of the enabling signal. The area of the transmission gate may become substantially large due to the generation of the complementary enabling signal. The gate area increases due to the routing of this complementary enabling signal through the transmission gate, which may be disadvantageous for high speed logic operations.

Another method for high-speed signal transmission operation for the transmission gate is known as a single-rail method. The single-rail method employs an inverter to produce the complementary enabling signal within the 'single-rail'. The inverter outputs the complimentary enabling signal after the transmission gate enabling signal is input to the inverter. However, use of the inverter in this single-rail method may also adversely affect high-speed operations in the transmission gate and/or the power used for high-speed logic operations. This type of transmission gate may typically be used in what is known as a multiplex (MUX) circuit.

FIG. 1 is a diagram of a conventional art MUX circuit. Referring to FIG. 1, in response to a selection signal S, a MUX circuit 100 may selectively transmit a first input signal A or a second input signal B as an output signal SO. The MUX circuit 100 may includes a first inverter 101 that produces a complementary selection signal SB by inverting the selection signal S; a second inverter 102 and a third inverter 103. The second inverter 102 may be configured to receive the first input signal A, and the third inverter 103 may be configured to receive the second input signal B.

MUX circuit 100 may include first and second transmission gates 104 and 105. In response to the selection signal S and the complementary selection signal SB, first and second transmission gates 104 and 105 may transmit outputs of the corresponding second inverter 102 and third inverter 103. A fourth inverter 106 may be configured to invert the outputs of the first and second transmission gates 104 and 105, respectively. These outputs are combined and input to fourth inverter 106 so as to generate the output signal SO, as shown in FIG. 1.

The conventional art MUX circuit 100 requires that the selection signal S and complementary selection signal SB (which enable the transmission gates 104 and 105) be transmitted to the transmission gates 104 and 105 later than input signals AB and BB are transmitted to the transmission gate for safe transmission of the signals. That is, transmission of the selection signal S and the complementary selection signal SB to the transmission gates 104 and 105 is delayed.

The time at which the complementary selection signal SB is generated is a function of the operational characteristics of the first inverter 101. Since the complementary selection signal SB is generated after a delay time of the first inverter 101, the complementary selection signal SB may interfere with the high-speed signal transmission operation of the MUX circuit 100.

SUMMARY OF THE INVENTION

An exemplary embodiment of the present invention is directed to a multiplex (MUX) circuit. The circuit may include a first buffer unit for receiving an inverted version of a first input signal to generate a first buffer unit output signal, a first switch for transmitting the first buffer unit output signal in response to a selection signal, and a first inverter for receiving the first input signal to generate a first inverter output signal. The circuit may additionally include a second switch for transmitting the first inverter output signal in response to the selection signal, a second inverter for receiving a second input signal to generate a second inverter output signal, a third switch for transmitting the second inverter output signal in response to the selection signal, and a third inverter receiving the first inverter output signal from the second switch and the second inverter output signal from the third switch to generate a third inverter output signal. The circuit may further include a second buffer unit for receiving an inverted version of the second input signal to generate a second buffer unit output signal, and a fourth switch for transmitting the second buffer unit output signal in response to the selection signal. The first buffer unit output signal, third inverter output signal and second buffer unit output signal may be combined at an output of the third inverter as a MUX circuit output signal.

Another exemplary embodiment of the present invention is directed to a MUX circuit. The circuit may include a first inverter for receiving a first input signal to generate a first inverter output signal, a second inverter for receiving a second input signal to generate a second inverter output signal, a third inverter for receiving the first inverter output signal to generate a third inverter output signal, and a fourth inverter for receiving the second inverter output signal to generate a fourth inverter output signal. The circuit may additionally include a first PMOS transistor receiving a selection signal at its gate, receiving the third inverter output signal at its source, and transmitting the third inverter output signal from its drain as a first output, a second PMOS transistor receiving the selection signal at its gate, receiving the first inverter output signal at its source, and transmitting the first inverter output signal from its drain as a second output, a first NMOS transistor receiving the selection signal at its gate, receiving the second inverter output signal at is source, and transmitting the second inverter output signal from its drain as a third output, and a second NMOS transistor receiving the selection signal at its gate, receiving the fourth inverter output at its source, and transmitting the fourth inverter output signal from its drain as a fourth output. The circuit may further include a fifth inverter receiving the second output from the second PMOS transistor and the third output from the first NMOS transistor to generate a MUX circuit output signal.

Another exemplary embodiment of the present invention is directed to a MUX circuit which may include a plurality of inverter pairs for receiving one of a first input signal and a second input signal to generate a plurality of inverter outputs. The circuit may also include a plurality of switches operatively connected to the plurality of inverter pairs and to a single selection signal for selectively transmitting at least one of the inverter outputs representing one of the first and second input signals as a MUX circuit output signal, based on the selection signal.

Another exemplary embodiment of the present invention is directed to a method of generating an output signal from a MUX circuit. The method may include generating a single selection signal in the MUX circuit, and transmitting one of a first signal and a second signal received as inputs to the MUX circuit as a MUX circuit output signal, based on the single selection signal.

BRIEF DESCRIPTION OF THE DRAWINGS

The present invention will become more apparent by describing, in detail, exemplary embodiments thereof with reference to the attached drawings, wherein like elements are represented by like reference numerals, which are given by way of illustration only and thus do not limit the exemplary embodiments of the present invention.

DETAILED DESCRIPTION OF THE EXEMPLARY EMBODIMENTS

Exemplary embodiments of the present invention will be described below in more detail with reference to the accompanying drawings. The present invention may, however, be embodied in different forms and should not be constructed as limited to the exemplary embodiments set forth herein. Rather, these exemplary embodiments are provided so that this disclosure will be thorough and complete, and will fully convey the scope of the invention to those skilled in the art. Like numerals refer to like elements throughout the specification.

Figure 1:
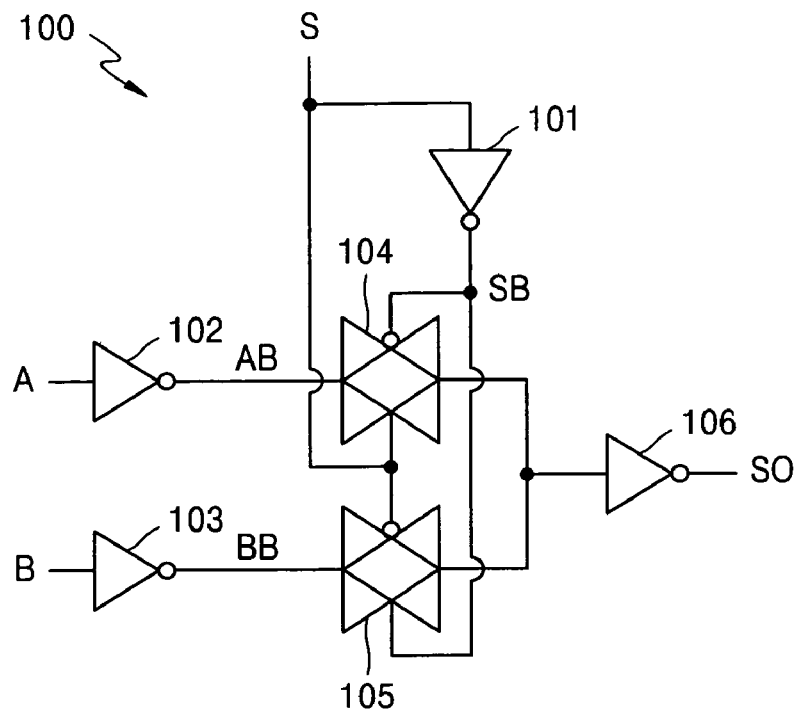
FIG. 1 is a circuit diagram of a conventional art multiplex (MUX) circuit.
Figure 2:
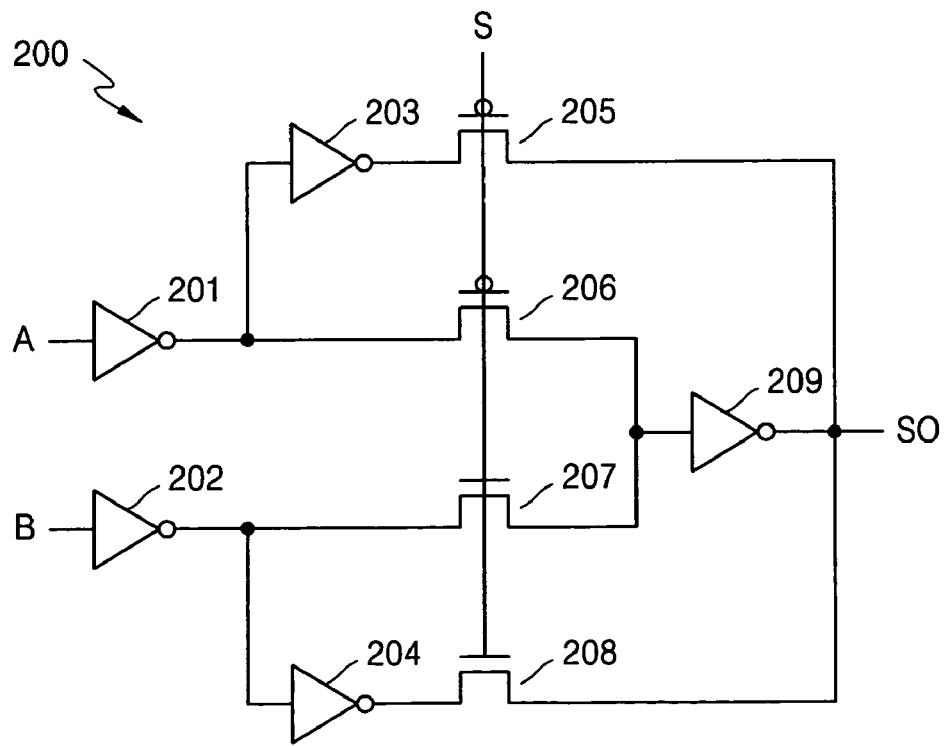
FIG. 2 is a circuit diagram of a high-speed MUX circuit according to an exemplary embodiment of the present invention.

FIG. 2 is a diagram of a high-speed multiplex (MUX) circuit according to an exemplary embodiment of the present invention. Referring to FIG. 2, a MUX circuit 200 may include first and second inverters 201 and 202 for receiving a corresponding first input signal A and a second input signal B. The first and second inverters 201, 202 invert the corresponding first input signal A and second input signal B to output a corresponding first inverter output signal and second inverter output signal. A third inverter 203 (first buffer unit) is adapted to receive the first inverter output signal from first inverter 201 to output a third inverter output signal (also referred to as a first buffer unit output signal). The third inverter output signal is representative of the first input signal A. A fourth inverter 204 (second buffer unit) is adapted to receive the second inverter output signal from second inverter 202 to output a fourth inverter output signal (also referred to as a second buffer unit output signal). The fourth inverter output signal is representative of the second input signal B.

MUX circuit 200 may include a first PMOS transistor 205 (first switch) and a second PMOS transistor 206 (second switch). First PMOS transistor 205 is configured to transmit the output of the first inverter 201 (first inverter output signal) in response to a selection signal S. Second PMOS transistor 206 is configured to transmit the output of the third inverter 203 (third inverter output signal) in response to the selection signal S.

MUX circuit 200 may include first NMOS transistor 207 (third switch) and second NMOS transistor 208 (fourth switch). First NMOS transistor 207 may be adapted to receive (at its source) and transmit (from its drain) the output of the second inverter 202 (second inverter output signal) in response to the selection signal S; second NMOS transistor 208 may be adapted to receive (at its source) and transmit (from its drain) the output of the fourth inverter 204 (fourth inverter output signal) in response to the selection signal S.

MUX circuit 200 may include and a fifth inverter 209 that is connected to the drains of the second PMOS transistor 206 and the first NMOS transistor 207. The drains of the first PMOS transistor 205 and the second NMOS transistor 208 (first and fourth inverter output signals) and the output of the fifth inverter 209 (generated from the input second and third inverter output signals) may be combined as an output signal SO for the MUX circuit 200.

In operation of the MUX circuit 200, if the selection signal S is a logic low level, the first and second PMOS transistors 205 and 206 may be turned on, and the first input signal A may be output as an output signal SO from MUX circuit 200. Meanwhile, when the selection signal S is the logic low level, the first and second NMOS transistors 207 and 208 are turned off so that the second input signal B is not output as the output signal SO. If the selection signal S is a logic high level, the first and second NMOS transistors 207 and 208 may be turned on (and first and second PMOS transistors 205 and 206 may be turned off) so that the second input signal B may be output as the output signal SO.

For example, in the case that first input signal A is a logic low level when a selection signal S is a logic low level, the output of the first inverter 201 (first inverter output signal) is produced as a logic high level and is provided as an input to the fifth inverter 209 through the second PMOS transistor 206. The fifth inverter 209 produces an output signal SO that is a logic low level. An output of the third inverter 203 (third inverter output signal) is also produced as a logic low level and is transmitted to the output of the fifth inverter 209 through the first PMOS transistor 205, as shown in FIG. 2. Consequently, the first input signal A at the logic low level is produced as the output signal SO (at the logic low level) through the MUX circuit 200.

In the case a first input signal A is a logic high level when the selection signal S is at a logic low level, an output of the first inverter 201 (first inverter output signal) is produced at a logic low level and is provided as an input to the fifth inverter 209 through the second PMOS transistor 206. The fifth inverter 209 produces an output signal SO that is at a logic high level. An output of the third inverter 203 (third inverter output signal) is also produced as a logic high level and is transmitted to the output of the fifth inverter 209 through the first PMOS transistor 205, as shown in FIG. 2. Here, a voltage level of the third inverter output signal that is transmitted to the output of the fifth inverter 209 is at a voltage level that has dropped by a threshold voltage of the first PMOS transistor 205 in addition to the voltage level of the logic high level. However, since a full-swing logic high level is output from the fifth inverter 209 as the output signal SO, the output signal SO becomes the voltage level of the logic high level. Therefore, the first input signal A at the logic high level is produced as the output signal SO (also at the logic high level) through the MUX circuit 200.

Meanwhile, as previously discussed, when the selection signal S is at the logic low level, the first and second NMOS transistors 207 and 208 may be turned off, so that the second input signal B cannot be output as the output signal SO.

In the case a second input signal B is a logic low level when a selection signal S is a logic high level, an output of the second inverter 202 (second inverter output signal) is produced as a logic high level and is provided to the fifth inverter 209 as an input through the first NMOS transistor 207. The fifth inverter 209 produces an output signal SO that is a logic low level. An output of the fourth inverter 204 (fourth inverter output signal) is produced as a logic low level and is transmitted to the output of the fifth inverter 209 through the second NMOS transistor 208, as shown in FIG. 2. Therefore, the second input signal B at the logic low level may be produced as the output signal SO (at the logic low level) through the MUX circuit 200.

In the case a second input signal B is a logic high level when a selection signal S is a logic high level, the output of the second inverter 202 is produced as a logic low level and is provided as an input to the fifth inverter 209 through the first NMOS transistor 207. The fifth inverter 209 produces an output signal SO that is a logic high level. The output of the fourth inverter 204 is produced as a logic high level and is transmitted to the output of the fifth inverter 209 through the second NMOS transistor 208, as shown in FIG. 2. Here, a voltage level of the fourth inverter output signal that is transmitted to the output of the fifth inverter 209 is at a voltage level that has dropped by a threshold voltage of the second NMOS transistor 208 in addition to the voltage level of the logic high level. However, since a full-swing logic high level is output from the fifth inverter 209 as the output signal SO, the output signal SO becomes the voltage level of the logic high level. As a result, the second input signal B at the logic high level is produced as the output signal SO (also at the logic high level) through the MUX circuit 200.

Meanwhile, as previously discussed, when the selection signal S is at the logic high level, the first and second PMOS transistors 205 and 206 may be turned off, so that the first input signal A cannot be output as the output signal SO.

Accordingly, only a single selection signal S is generated in the MUX circuit 200 and received by the gates of the switches (PMOS transistors 205 and 206, NMOS transistors 207 and 208). The MUX circuit 200 may thus selectively transmit one of the first input signal A and the second input signal B, received as inputs to the MUX circuit 200, as a MUX circuit output signal SO, based on the state of the single selection signal.

Therefore, the MUX circuit 200 of the present invention uses one selection signal S to selectively transmit either the first signal A or the second input signal B to the output thereof. Further, the exemplary MUX circuit does not need the inverter required in the conventional art MUX circuit to generate a complimentary (inverted) selection signal and an area for routing the complimentary selection signal, since no complementary selection signal need be generated. This may be desirable for serving digital video and other high-speed signal switching applications for digital technologies.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A multiplex (MUX) circuit, comprising:
   a first buffer unit for receiving an inverted version of a first input signal to generate a first buffer unit output signal;
   a first switch for transmitting the first buffer unit output signal in response to a selection signal;
   a first inverter for receiving the first input signal to generate a first inverter output signal;
   a second switch for transmitting the first inverter output signal in response to the selection signal;
   a second inverter for receiving a second input signal to generate a second inverter output signal;
   a third switch for transmitting the second inverter output signal in response to the selection signal;
   a third inverter receiving the first inverter output signal from the second switch and the second inverter output signal from the third switch to generate a third inverter output signal;
   a second buffer unit for receiving an inverted version of the second input signal to generate a second buffer unit output signal; and
   a fourth switch for transmitting the second buffer unit output signal in response to the selection signal,
   wherein the first buffer unit output signal, third inverter output signal and second buffer unit output signal are combined at an output of the third inverter as a MUX circuit output signal.

2. The circuit of claim 1, wherein
   the first buffer unit is embodied as an inverter connected between the first inverter and first switch, and
   the second buffer unit is embodied as an inverter connected between the second inverter and fourth switch.

3. The circuit of claim 1, wherein the first switch is embodied as a PMOS transistor receiving the selection signal at its gate, receiving the first buffer unit output signal at its source, and transmitting the first buffer unit output signal from its drain to the output of the third inverter.

4. The circuit of claim 1, wherein the second switch is embodied as a PMOS transistor receiving the selection signal at its gate, receiving the first inverter output signal at its source, and transmitting the first inverter output signal as an input to the third inverter.

5. The circuit of claim 1, wherein the third switch is embodied as a NMOS transistor receiving the selection signal at its gate, receiving the second inverter output signal at its source, and transmitting the second inverter output signal as an input to the third inverter.

6. The circuit of claim 1, wherein the fourth switch is embodied as a NMOS transistor receiving the selection signal at its gate, receiving the second buffer unit output signal at its source, and transmitting the second buffer unit output signal from its drain to the output of the third inverter.

7. A multiplex (MUX) circuit, comprising:
   a first inverter for receiving a first input signal to generate a first inverter output signal;
   a second inverter for receiving a second input signal to generate a second inverter output signal;
   a third inverter for receiving the first inverter output signal to generate a third inverter output signal;

a fourth inverter for receiving the second inverter output signal to generate a fourth inverter output signal;

a first PMOS transistor receiving a selection signal at its gate, receiving the third inverter output signal at its source, and transmitting the third inverter output signal from its drain as a first output;

a second PMOS transistor receiving the selection signal at its gate, receiving the first inverter output signal at its source, and transmitting the first inverter output signal from its drain as a second output;

a first NMOS transistor receiving the selection signal at its gate, receiving the second inverter output signal at is source, and transmitting the second inverter output signal from its drain as a third output;

a second NMOS transistor receiving the selection signal at its gate, receiving the fourth inverter output at its source, and transmitting the fourth inverter output signal from its drain as a fourth output; and a fifth inverter receiving the second output from the second PMOS transistor and the third output from the first NMOS transistor to generate a MUX circuit output signal.

8. A multiplex (MUX) circuit, comprising:

a plurality of inverter pairs for receiving one of a first input signal and a second input signal to generate a plurality of inverter outputs; and a plurality of switches operatively connected to a single selection signal and one of the first input signal and second input signal via an inverter pair for selectively transmitting at least one of the inverter outputs representing one of the first and second input signals as a MUX circuit output signal, based on the single selection signal, wherein each inverter of each of the inverter pairs is directly connected to at least one switches of the plurality of switches.

9. The circuit of claim 8, wherein no inverted selection signal is generated to transmit the MUX circuit output signal.

10. The circuit of claim 8, wherein the plurality of inverter pairs include a first inverter pair and a second inverter pair, the first inverter pair further including:

a first inverter for receiving the first input signal to generate a first inverter output signal;

a third inverter for receiving the first inverter output signal to generate a third inverter output signal;

the second inverter pair further including:

a second inverter for receiving the second input signal to generate a second inverter output signal; and a fourth inverter for receiving the second inverter output signal to generate a fourth inverter output signal.

11. The circuit of claim 10, wherein the plurality of switches include:

a first PMOS transistor configured to receive the selection signal at its gate, the third inverter output signal at its source, and configured to transmit the third inverter output signal from its drain as a first output;

a second PMOS transistor configured to receive the selection signal at its gate, the first inverter output signal at its source, and configured to transmit the first inverter output signal from its drain as a second output;

a first NMOS transistor configured to receive the selection signal at its gate, the second inverter output signal at is source, and configured to transmit the second inverter output signal from its drain as a third output; and a second NMOS transistor configured to receive the selection signal at its gate, the fourth inverter output at its source, and configured to transmit the fourth inverter output signal from its drain as a fourth output.

12. The circuit of claim 11, further comprising:

a fifth inverter configured to receive the second output from the second PMOS transistor and the third output from the first NMOS transistor to generate the MUX circuit output signal.

13. The circuit of claim 8, wherein a state of the MIJX circuit output signal is a function of the state of one of the selection signal and one of the first and second input signals.

14. The circuit of claim 8, wherein the state of the selection signal determines which of the plurality of switches are turned on and turned off for transmitting at least one inverter output signal representing either the first input signal or the second input signal as the MUX circuit output signal.

15. A method of generating an output signal from a multiplex (MUX) circuit, comprising:

generating a single selection signal in the MUX circuit, and transmitting one of a first signal and a second signal, received as inputs to the MUX circuit, through one of a plurality of switches connected to one of the first signal and the second signal and to the single selection signal as a MUX circuit output signal, based on the single selection signal, wherein the single selection signal is directly connected to each of the plurality of switches, and wherein the first single is connected to at least a first two switches of the plurality of switches and the second signal is connected to at least a second two switches of the plurality of switches, the second two switches being different from the first two switches.

16. The method of claim 15, wherein no inverted selection signal is generated in the MUX circuit to transmit the MUX circuit output signal.

17. The method of claim 15, wherein a state of the MUX circuit output signal is a function of the state of one of the selection signal and one of the first and second input signals.

18. The method of claim 15, wherein a state of the selection signal determines whether the first or second input signal is to be transmitted as the MUX circuit output signal.

* * * * *